United States Patent [19]
Cline et al.
[11] 4,171,990
[45] Oct. 23, 1979

[54] MIGRATION OF UNIFORM FINE LINES FOR BODIES OF SEMICONDUCTOR MATERIALS HAVING A (100) PLANAR ORIENTATION OF A MAJOR SURFACE

[75] Inventors: Harvey E. Cline; Thomas R. Anthony, both of Schenectady, N.Y.

[73] Assignee: General Electric Company, Schenectady, N.Y.

[21] Appl. No.: 944,276

[22] Filed: Sep. 21, 1978

[51] Int. Cl.[2] ............ H01L 7/00
[52] U.S. Cl. ............ 148/1.5; 148/178; 148/188
[58] Field of Search ............ 148/1.5, 188, 178

[56] References Cited

U.S. PATENT DOCUMENTS 3,998,662 12/1976 Anthony et al. ............ 148/187 X

*Primary Examiner*—G. Ozaki
*Attorney, Agent, or Firm*—Donald M. Winegar; Joseph T. Cohen; Leo I. MaLossi

[57] ABSTRACT

Metal wires of widths as small as 10 microns are migrated by thermal gradient zone melting processing as a molten zone through a body of semiconductor material. By calculating the width and thickness of the metal wires deposited on the wafer surface, improved uniform doped regions are produced. The method is restricted to the (100) planar orientation.

22 Claims, 5 Drawing Figures

MIGRATION OF UNIFORM FINE LINES FOR BODIES OF SEMICONDUCTOR MATERIALS HAVING A (100) PLANAR ORIENTATION OF A MAJOR SURFACE

BACKGROUND OF THE INVENTION

1. Field of the Invention

This invention relates to a method of moving a molten zone of material through a solid body of semiconductor material and, in particular, to the migration of a metal "wire" through material having a diamond cubic crystal structure and at least one surface of the body has a (100) planar crystal orientation.

2. Description of the Prior Art

W. G. Pfann describes in "Zone Melting", John Wiley and Sons, Inc., New York (1966), a thermal gradient zone melting process to produce various desirable material configurations in a body of semiconductor material. The process had previously been disclosed in his issued U.S. Pat. No. 2,813,048, based on his application filed June 24, 1954. In both instances, cavities are generally formed in the surface of the body and a piece of wire of the metal to be migrated is disposed in the cavity. However, the resulting structures were not desirable for semiconductor usage.

M. Blumenfeld, in U.S. Pat. No. 3,897,277, teaches alloying aluminum to the surface of a body of silicon semiconductor material in an attempt to maintain the registry of the pattern of metal deposits to be migrated. However, problems of registry of the metal still plague one's attempt to obtain the precise orientation necessary for an array of deep diodes suitable for making X-ray imaging devices.

Recently, T. R. Anthony and H. E. Cline, discovered that employing selected etching of the surface and preferred crystallographic orientation enabled one to employ thermal gradient zone melting processing to make semiconductor devices commercially. The improved process resulted in a large savings in energy required to process semiconductor materials and increased the yields of devices fabricated thereby. For further information, one is directed to the teachings of Anthony and Cline in their recently granted U.S. Pat. No. 3,904,442, and U.S. Pat. No. 3,979,230.

There are a variety of applications for the unique vertical-junction geometries made possible by thermal migration. However, in many cases for thermal migration to compete with the highly developed conventional planar technology, it is necessary to control the widths of the narrow doped regions. Photolithograph techniques were used to form the initial metal stripes that are subsequently melted and moved across the thin silicon wafer in a thermal gradient. A thermal gradient is established by either an electron beam or a tungsten filament. Both heat flow by radiation and thermal conduction are considered in the calculation of the thermal gradient. The optical absorption of silicon becomes important because of the partial infrared transparency of silicon. Wafers with a range of stripe dimensions are processed at different temperatures to determine the effect of wafer orientation, film thickness, stripe width, and heating method on thermomigration processing.

A problem occurs in matching the width of the doped recrystallized material to that of the deposited film width because the width of the liquid zone depends on the processing temperature.

It is therefore an object of this invention to provide a new and improved method for moving a molten zone within a solid body, or water, of semiconductor material which overcomes the deficiencies of the prior art.

Another object of the invention is to provide a method for predicting the dimensions of the stripe of metal needed to produce a predetermined width of recrystallized dope material.

Another object of the invention is to provide a new and improved method for producing a uniform selectively doped region of constant width.

Other objects of this invention will, in part, be obvious and will, in part, appear hereinafter.

BRIEF DESCRIPTION OF THE INVENTION

In accordance with the teachings of this invention, there is provided an improved method for the migration of a molten zone through a solid body of semiconductor material to form a region of recrystallized semiconductor material of the body therein. In particular, the improved method is preferred for forming regions as small as 10 microns in width or diameter. The process steps of the improved method include selecting a body of single crystal semiconductor material having two major opposed surfaces being respectively the top and bottom surfaces thereof. The body has a preferred crystallographic structure, a planar orientation of (100) for at least the top surface, a first selected type conductivity and a selected level of resistivity. The body also has a vertical axis which is substantially aligned with the $\langle 100 \rangle$ axis of the crystal structure and which is also substantially perpendicular to the top surface.

At least one mass of metal is deposited on the top surface of the body. The mass may have a disk-like configuration or a linear configuration. Should the metal have a linear configuration, the longitudinal axis is substantially aligned with the $\langle 011 \rangle$ or $\langle 0\bar{1}1 \rangle$ wire direction. The metal itself may be of one or more different materials to produce the desired physical characteristics of the region of semiconductivity to be formed by thermal gradient zone melting. Preferably, the mass of metal is deposited onto the surface by any suitable means which produces a substantially oxygen-free mass of metal. No mask, sintering, alloying, or etching, of the surface is required to help initiate migration of the melt of the metal.

The body and the deposited metals are then heated to a preselected elevated temperature sufficient to form a melt of a metal-rich semiconductor material on the surface of the body. The temperature may range from 700° C. to 1350° C. A temperature gradient of from 50° C. per centimeter to 200° C. per centimeter is then established substantially parallel with the vertical axis of the body and the $\langle 100 \rangle$ axis of the crystal structure thereof. The surface on which the melt is formed is maintained at the lower temperature. Thereafter, each melt of metal-rich semiconductor material is moved as a molten zone through the solid body of semiconductor material. The process is practiced for a sufficient period of time to reach a predetermined depth in the body from the top surface. The process may be practiced to move the molten zone entirely through the body from one surface to the other or may be stopped between the surfaces and a reversed gradient imposed to move the molten zone, preferably along the same initial track, to the top surface. In either case, the movement of each molten zone through the solid body of semiconductor material of the body produces a region of recrystallized semiconductor material of the body having solid solubility of the deposited material therein. The region so produced also has a substantially uniform cross-sectional area and a substantially uniform level of resistivity throughout the entire region.

The width w of the metal layer is set equal to the predetermined width of the region to be doped by the temperature gradient zone melting process. However, the thickness of the metal layer is calculated to give a uniformly wide recrystallized material and depends on the phase diagram and process temperature.

DESCRIPTION OF THE INVENTION

Figure 1:
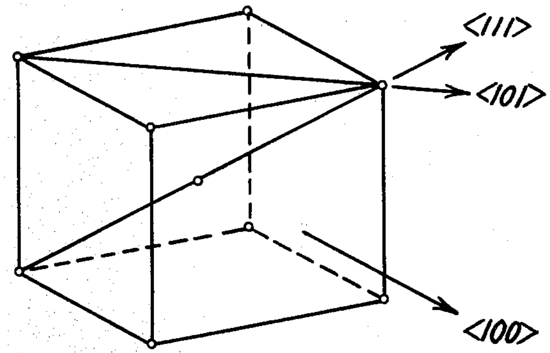
FIG. 1 is a diamond cubic crystal structure.

Referring now to FIG. 1, there is shown the diamond cubic crystal system of silicon, silicon carbide, germanium, gallium arsenide, and other semiconductor materials consisting of a compound of a Group II element and a Group VI element and a compound of a Group III element and a Group V element.

In order to practice the new improved thermal gradient zone melting process of this invention, it is necessary that the planar orientation of one of the two major opposed surfaces of the wafer of semiconductor material be (100). The (100) plane is that plane which coincides with a face of the unit cube. Other planar orientations usually suitable for the surface 12, but of no interest in this particular application, are the (110) plane and the (111) plane. The (110) plane is that plane which passes through a pair of diagonally opposite edges of the unit cube. Those planes which pass through a corner atom and through a pair of diagonally opposite atoms located in a face not containing the first mentioned atoms are generally identified as (111) planes. As a matter of convenience, directions in the unit cube which are perpendicular to each of these generic planes (X Y Z) are customarily referred to as the "crystal zone axis" of the particular planes involved, or more usually as the "X Y Z direction".

Figure 2:
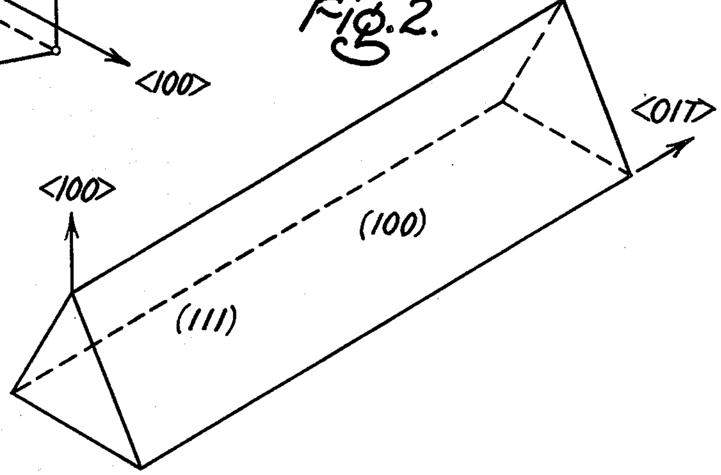
FIG. 2 is the morphological shape of wires which thermal migrate stably in the $\langle 100 \rangle$ direction.

The crystal zone axis of the (100) generic plane will be referred to as the $\langle 100 \rangle$ direction and the crystal zone axis of the (111) plane as the $\langle 111 \rangle$ direction, and to the crystal zone axis of the (110) plane as the $\langle 110 \rangle$ direction. Examples of these directions with respect to the unit cube are shown by the appropriately identified arrows in FIG. 1. In particular, for the (100) planar orientation, metal-rich wires of material can only be migrated stably in the $\langle 100 \rangle$ direction. In addition, only wires lying in the $\langle 011 \rangle$ and the $\langle 0\bar{1}1 \rangle$ directions are stable in migration in the $\langle 100 \rangle$ axis direction. The morphological shape of these stable metal-rich wires of material is shown in FIG. 2. Solid liquid surface tension causes coarsening of the ends of the stable metal-rich liquid wires.

Although lying in the same (100) planar region, wires of metal-rich liquid, which by lying in directions other than the $\langle 011 \rangle$ and $\langle 0\bar{1}1 \rangle$ directions, are unstable and break up into a row of pyramidal square-base droplets of metal-rich liquid material because of severe faceting of the solid-liquid interface of wires lying in these directions. Thus, for example, wires lying in the $\langle 012 \rangle$ and $\langle 0\bar{2}1 \rangle$ directions are unstable.

The dimensions of the metal wires also influence the stability of the metal wires. Only metal wires which are no greater than 100 microns in width are stable during the migration of the wires in the $\langle 100 \rangle$ direction for a distance of at least 1 centimeter into the body of semiconductor material. Wire stability increases with decreasing wire size. The more the size of the liquid metal wire exceeds 100 microns, the less the distance that the liquid wire is able to penetrate the body during migration before the wire becomes unstable and breaks up.

A critical factor influencing the liquid metal and wire stability during migration is the parallelism of the applied thermal gradient to the $\langle 100 \rangle$ crystallographic direction. An off axis component of the thermal gradient in general decreases the stability of the migrating liquid by causing tooth-like, or serrated, facets to develop in the side faces of the wire. When the tooth-like facets become too large, the wire breaks up and loses its continuity.

To fabricate a grid structure wherein the planar region is (100) and the migration direction is $\langle 100 \rangle$, it is necessary to migrate a first array of liquid wires through the body to form one group of spaced planar regions which are substantially perpendicular to, and intersect, the first group of spaced planar regions. Simultaneous migration of the liquid wires to form the two groups of regions most often results in discontinuities in the grid structure. Investigation of the reasons for the discontinuities indicates that the surface tension of the molten metal-rich material at the intersections of two migrating liquid wires is sufficiently great to cause discontinuities in the intersecting liquid wires. Apparently, the solid-liquid surface tension is sufficient to each portion of the intersecting migrating wires to cause the metal-rich liquid to remain with its own wire portion instead of being distributed uniformly throughout the intersection of the wires in the body. As a result, material of the body at the advancing interface of the supposedly intersecting wires does not become wetted by the liquid wires or even contacted by the liquid and therefore is not dissolved into the advancing metal-rich liquid, therefore, discontinuity occurs at the intersection and further advancement of the liquid wires produces an imperfect grid. In instances where the discontinuities of the grid is present, mutually adjacent regions of the conductivity types of the body, which are formed by the grid structure, are not electrically isolated from each other and may deleteriously affect the reliability of electrical circuitry associated therewith.

Figure 3:
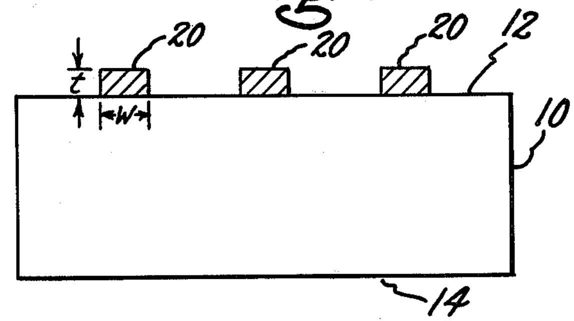
FIG. 3 is a side elevation view, partly in cross-section, of a body of semiconductor material processed in accordance with the teachings of this invention.

With reference to FIG. 3, there is shown a body 10 of semiconductor material having opposed major surfaces 12 and 14, a selected resistivity and a first type of conductivity. Metal layers 20 are deposited on the surface 12 with an electron-beam evaporator to a predetermined thickness t and patterned using photolithography to a predetermined width w.

Figure 4:
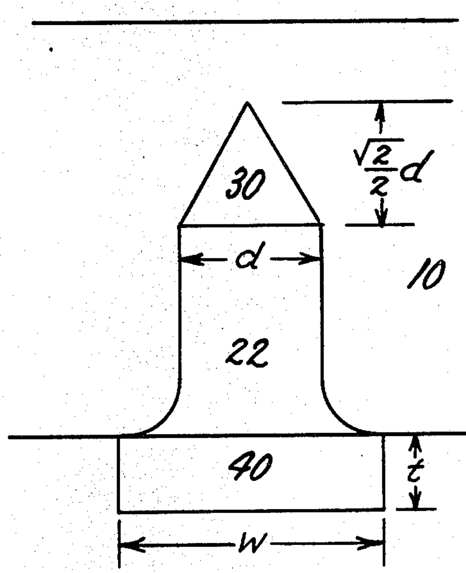
FIG. 4 is a side elevation view of a schematic of the movement of a droplet resulting from a metal deposit of width w and thickness t, migrating through a solid body by thermal gradient zone melting processing.
Figure 5:
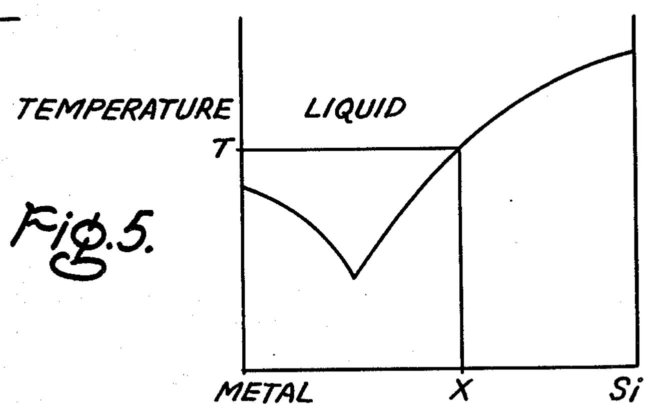
FIG. 5 is a phase diagram indicating the solubility of metal x in silicon at various temperatures.

With reference to FIG. 4 there is shown a body of semiconductor material having a selected resistivity and a first type of conductivity. If the ratio of the width w to the thickness t of the metal layer 40 is too great, then the width d of the liquid zone 30 is less than the metal width w and the recrystallized region 22 is not uniform. During processing the metal becomes molten and dissolves an atomic fraction x of the semiconductor material which increases the volume of the liquid 30. The solubility x in the liquid of the semiconductor material at a given process temperature may be obtained from a phase diagram indicated in FIG. 5. The solubility in the liquid increases with increasing temperature.

A calculation of the relation between the width of the liquid and the dimensions of the metal layer is made by a material balance and the geometry of the liquid zone.

$$d^2 = \frac{2\sqrt{2}\,wt}{(1-x)} \quad (1)$$

In order to produce a recrystallized region of uniform width d, the width of the metal layer must match the width of the liquid zone, w=d. Solving for the ratio of the film thickness to the film width in (1) results in $$\frac{t}{w} = \frac{(1-x)}{2\sqrt{2}} \quad (2)$$

Thus when the solubility is determined from the phase diagram at a predetermined process temperature, the desired film thickness t can be found by the above equation (2).

The temperature gradient zone melting process is practiced at a temperature of from 700° C. to 1300° C. The thermal gradient during the process is maintained at from 50° C. per centimeter to 200° C. per centimeter.

The following Example is illustrative of the teachings of this invention:

EXAMPLE

Silicon wafers 0.028 cm thick were obtained from Monsanto with a (100) planar orientation. An aluminum film 2$\mu$ thick was deposited on freshly cleaned wafers with an electron beam evaporator at $10^{-5}$ torr and at a deposition rate of 1$\mu$/min. A layer of photoresist was then spun on the Al film and patterned using a resolution mask consisting of 15 sets of lines 10–500$\mu$ wide. The lines were oriented in the <011> direction to produce a stable liquid shape. After the photoresist was developed, the excess Al between the lines was etched away leaving Al stripes on the surface of the wafer for subsequent thermomigration.

Equipment was constructed using a tungsten-mesh filament to heat the wafer by radiation in either vacuum or an inert atmosphere. The filament was a 12×12-cm square consisting of four Sylvania tungsten-mesh elements that were welded in a serpentine configuration and surrounded by molybdenum radiation shields to conserve heat. The wafer temperature could not be determined with an optical pyrometer, because reflected radiation from the filament on the wafer gives a false temperature reading. An approximate measure of the wafer temperature was obtained by calibration of the filament temperature against various melting points of metallic eutectics placed on the hot wafer. Photographs of the wafer were taken in the light of the hot filament to determine the time that elapsed between heating the wafer and the emergence of the fine wires on the hot wafer surface. The migration temperature was about 1300° C. and the thermal gradient calculated to be about 109° C./cm.

Upon completion of processing by thermal gradient zone melting, the wafer was sectioned and stained to measure the width of the recrystallized zone d which was compared to the width of the metal layer w in Table 1. At about 50 microns the widths of the metal layer match that of the recrystallized material.

A calculation of the ratio of the thickness to the width of the metal layer that gives uniform doped regions was calculated by using equation 2. Employing the Al-Si phase diagram, values of the solubility are listed at different temperatures along with the ratio of the thickness to width of the metal layer in Table 2. As the temperature increases the thickness needed to produce uniform migration of fine lines decreases for a constant metal layer width.

TABLE 1

| d (microns) | w (microns) |
|---|---|
| 140 | 290 |
| 130 | 240 |
| 112 | 200 |
| 95 | 160 |
| 80 | 120 |
| 72 | 100 |
| 60 | 60 |
| 50 | 50 |
| 45 | 40 |
| 40 | 30 |
| 35 | 20 |
| 30 | 15 |

TABLE 2

| T °C. | X Atomic Fraction | t/w |
|---|---|---|
| 900 | .36 | .23 |
| 950 | .40 | .21 |
| 1000 | .44 | .20 |
| 1050 | .49 | .18 |
| 1100 | .53 | .17 |
| 1150 | .59 | .14 |
| 1200 | .65 | .12 |
| 1250 | .72 | .099 |
| 1300 | .79 | .074 |
| 1350 | .88 | .042 |
| 1400 | .95 | .017 |

In the same manner, equations 1 and 2 can be employed to calculate approximately the ratio of the thickness to the width of the metal layer that gives uniform doped regions equal to the width of the metal when migration is practiced at from 2° to 10° off the <100> crystal axis. Migration will be vertical to the two opposed major surfaces and the planar crystal orientation of the major surfaces will be off axis. Stable wire directions will lie along the same direction as previously stated.

We claim as our invention:

1. In an improved method for the migration of a molten zone through a solid body of semiconductor material to form a region comprising the process steps of:

a. selecting a body of single crystal semiconductor material having two major opposed surfaces being respectively the top and bottom surface thereof; a preferred crystallographic structure; a planar orientation of (100) for—at least the top surface thereof, a first selective type conductivity; a selected level of resistivity, and a vertical axis substantially aligned with the <100> axis of the crystal structure and which is also substantially perpendicular to the top surface;

b. depositing at least one mass of metal on the top surface of the body;

c. heating the body and the deposited metal to a preselected elevated temperature sufficient to form a melt of a metal-rich semiconductor material therein;

d. establishing a temperature gradient substantially parallel to the vertical axis of the body and the <100> axis of the crystal structure, the surface on which the melt is formed being at the lower temperature, and e. migrating each melt of metal-rich semiconductor material as a molten zone through the solid body of semiconductor material for a sufficient period of time to reach a predetermined depth in the body from the top surface and to form a region of recrystallized semiconductor material of the body having solid solubility of the deposited metal therein having a width equal to the width of the metal deposited for forming the melt, a substantially uniform cross-sectional area and a substantially uniform level of resistivity throughout the entire region, the improvement comprising the steps of depositing the mass of metal of a predetermined thickness t and a predetermined width w which is expressed by the following formula:

$$t = \frac{(1-x)}{2\sqrt{2}}[w]\,d$$

wherein:

t is the thickness of the metal deposited, d is the width of the recrystallized region of semiconductor material to be formed in situ in the body, x is the solubility of the semiconductor material in the metal to be migrated at a given processing temperature and the width w of the mass of metal is equal to the width d of the recrystallized region.

2. The method of claim 1 wherein the semiconductor material of the body is one selected from the group consisting of silicon, silicon carbide, germanium and gallium arsenide.

3. The method of claim 2 wherein the semiconductor material is silicon having N-type conductivity, and the metal is aluminum.

4. The method of claim 3 wherein the temperature gradient is from 50° C. to 200° C. per centimeter, and the migration is practiced at a temperature of from 700° C. to 1350° C.

5. The method of claim 1 wherein each melt of metal is migrated through the entire body from the one major opposed surface to, and to terminate in, the other of the opposed major surfaces.

6. The method of claim 5 wherein the semiconductor material of the body is one selected from the group consisting of silicon, silicon carbide, germanium and gallium arsenide.

7. The method of claim 6 wherein the semiconductor material is silicon having N-type conductivity, and the metal is aluminum.

8. The method of claim 7 wherein the temperature gradient is from 50° C. to 200° C. per centimeter, and the migration is practiced at a temperature of from 700° C. to 1350° C.

9. The method of claim 1 wherein each mass of metal has a wire-like geometrical configuration and is oriented in a direction substantially aligned with a crystal axis which is at least one selected from the group consisting of <011> and $<0\bar{1}1>$.

10. The method of claim 9 wherein the semiconductor material of the body is one selected from the group consisting of silicon, silicon carbide, germanium and gallium arsenide.

11. The method of claim 10 wherein the semiconductor material is silicon having N-type conductivity, and the metal is aluminum.

12. The method of claim 11 wherein the temperature gradient is from 50° C. to 200° C. per centimeter, and the migration is practiced at a temperature of from 700° C. to 1350° C.

13. The method of claim 9 wherein the semiconductor material of the body is one selected from the group consisting of silicon, silicon carbide, germanium and gallium arsenide.

14. The method of claim 13 wherein the semiconductor material is silicon having N-type conductivity, and the metal is aluminum.

15. The method of claim 14 wherein the temperature gradient is from 50° C. to 200° C. per centimeter, and the migration is practiced at a temperature of from 700° C. to 1350° C.

16. The method of claim 9 wherein the width of each wire is less than about 100 microns.

17. The method of claim 9 wherein the width of each wire is of the order of 10 microns.

18. The method of claim 9 wherein the metal is vapor deposited.

19. The method of claim 9 wherein the deposited metal is substantially oxygen free.

20. The method of claim 1 wherein the metal is vapor deposited.

21. The method of claim 1 wherein the deposited metal is substantially oxygen free.

22. The method of claim 1 wherein the deposited metal is aluminum 2 microns thick and 50 microns wide, the process temperature is 1300° C. and the semiconductor material is silicon.

* * * * *